(12) United States Patent
Ishihara et al.

(10) Patent No.: US 7,109,660 B2
(45) Date of Patent: Sep. 19, 2006

(54) PLASMA PROCESSING DEVICE AND BAFFLE PLATE THEREOF

(75) Inventors: Hiroyuki Ishihara, Yamanashi (JP); Youichi Araki, Yamanashi (JP); Toshiki Takahashi, Yamanashi (JP); Takuya Kubo, Yamanashi (JP); Atsushi Ito, Yamanashi (JP); Yoko Ono, Kanagawa (JP)

(73) Assignee: Tokyo Electron Limited, Tokyo (JP)

( * ) Notice: Subject to any disclaimer, the term of this patent is extended or adjusted under 35 U.S.C. 154(b) by 54 days.

(21) Appl. No.: 10/508,700

(22) PCT Filed: Mar. 28, 2003

(86) PCT No.: PCT/JP03/03954

§ 371 (c)(1),
(2), (4) Date: Sep. 29, 2004

(87) PCT Pub. No.: WO03/083923

PCT Pub. Date: Oct. 9, 2003

(65) Prior Publication Data

US 2005/0167052 A1    Aug. 4, 2005

(30) Foreign Application Priority Data

Mar. 29, 2002 (JP) ............................ 2002-096236
Aug. 5, 2002 (JP) ............................ 2002-227259

(51) Int. Cl.
*H01J 7/24* (2006.01)

(52) U.S. Cl. ............................ 315/111.11; 315/111.71

(58) Field of Classification Search ........... 315/111.11, 315/111.21, 111.41, 111.71; 118/722, 723 R; 156/345.29, 345.33, 345.34, 345.47, 345.51; 216/63, 67, 71; 427/569

See application file for complete search history.

(56) References Cited

U.S. PATENT DOCUMENTS

| 5,605,637 A | * | 2/1997 | Shan et al. .................... 216/71 |
| 6,264,788 B1 | * | 7/2001 | Tomoyasu et al. ...... 156/345.43 |
| 6,379,756 B1 | * | 4/2002 | Komino ...................... 427/569 |
| 2002/0038791 A1 | * | 4/2002 | Okumura et al. ............. 216/71 |

FOREIGN PATENT DOCUMENTS

| EP | 786794 | 7/1997 |
| JP | 07-245295 | 9/1995 |
| JP | 11-121437 | 4/1999 |

* cited by examiner

*Primary Examiner*—Thuy Vinh Tran
(74) *Attorney, Agent, or Firm*—Oblon, Spivak, McClelland, Maier & Neustadt, P.C.

(57) ABSTRACT

A plasma processing device is able to positively enhance a process-gas exhaust efficiency in a processing region and restrict plasma leaking. A processing container of a magnetron type parallel plate plasma processing device has a separator for separating the inside of the processing container into a processing region and an exhaust region. The separator has a plurality of gas passage holes to establish communication between the processing region and the exhaust region, and consists of a non-conductive member. A conductive member is disposed on a gas passage-side surface facing the gas passage holes. A voltage V is applied by a power supply to the conductive member so that the gas passage-side surface is at a potential higher than that of a processing-region surface.

36 Claims, 16 Drawing Sheets

PLASMA PROCESSING DEVICE AND BAFFLE PLATE THEREOF

CROSS-REFERENCE TO RELATED APPLICATIONS

This application is a National Stage Application of International Application PCT/JP03/03954, filed on Mar. 28, 2003, which claims priority to Japanese Application No. 2002-96236 filed on Mar. 29, 2002, and to Japanese Application No. 2002-227259 filed on Aug. 5, 2002.

FIELD OF THE INVENTION

The present invention relates to a plasma processing device and a baffle plate thereof; and, more particularly, to a plasma processing device and a baffle plate thereof for performing a processing such as an etching, a surface modification, a thin film forming, or the like.

BACKGROUND OF THE INVENTION

In a recent trend of miniaturization of a semiconductor device, a processing technology having a high degree of accuracy on a semiconductor wafer is required. For performing a high accuracy microprocessing on the semiconductor wafer, e.g., a plasma etching processing, a magnetron type parallel plate plasma processing device has been commonly used.

FIG. 13 offers a schematic configuration of a magnetron type parallel plate plasma processing apparatus of a conventional art.

As shown in FIG. 13, a plasma processing apparatus 80 includes a processing container 81, and the processing container 81 contains an upper electrode 82 and a lower electrode 83 in a top part and a lower part thereof, respectively, wherein the lower part has a mounting surface in a top part thereof, on which a semiconductor wafer W as an object to be processed is mounted. The processing container 81 contains in the vicinity of the top part of the lower electrode 83 a separator 86 for dividing an inside of the processing container 81 into a processing region 84 and an exhaust region 85. The upper electrode 82 has a plurality of gas inlet holes (not shown) for introducing a processing gas into the processing region 84. The separator 86 has a plurality of gas passage holes 86a penetrating through the processing region 84 and the exhaust region 85 such that the processing gas inside the processing region 84 is exhausted to the exhaust region 85.

In the plasma processing apparatus 80, a high density plasma is produced in the processing region 84 into which the processing gas is introduced through the gas inlet holes formed in the upper electrode 82 by a high frequency field and a parallel field, wherein the high frequency field is excited between the upper electrode 82 and the lower electrode 83 by a high frequency power source (not shown) connected to the lower electrode 83 via a matching circuit, and the parallel field is generated by an annular permanent magnet 87 disposed around an upper part of the processing container 81.

FIGS. 14 through 16 explain processing gas flows inside the processing region in the vicinity of the gas passage holes 86a of the separator 86 in FIG. 13.

As shown in FIG. 14, a plasma 40, which is generated by the high frequency field excited between the upper electrode 82 and the lower electrode 83 and the parallel field normal to the high frequency field, is produced in the processing region 84, and a sheath 45 is formed in the vicinity of the separator 86 to thereby generate a sheath field 44. The plasma 40 is formed of neutral gas particles 41, positive charged particles 42, and negatively charged particles 43. Meanwhile, in contrast with FIG. 14, under a common condition (not shown) where there is no electrical or magnetic restriction for charged particles, the charged particles have same movements as the neutral gas particles 41 to thereby be exhausted through the gas passage holes 86a together with the neutral gas particles 41. As a result, a leakage of the plasma 40 from the separator 86 to a manifold part (exhaust region 85) occurs. Due to the leakage of the plasma 40 to the manifold part, inner wall components of the manifold part are eroded, so that a lifetime of the plasma processing apparatus 80 is shortened. And, at the same time, there is a difficulty in controlling an inner pressure of the processing region 84 by way of a CM for pressure control, which is disposed in the manifold part, since it is difficult to keep a pressure of the manifold part constant.

When the positively charged particles 42 and the negatively charged particles 43 move in a same direction, the plasma 40 is ambipolarly diffused. Therefore, the leakage of the plasma 40 can be prevented by suppressing movements of either the negatively or the positively charged particles. As a method thereof, a method for providing a barrier by making the gas passage holes 86a small by employing an electric field formed on the separator 86 has been disclosed.

However, a suppressing efficiency of the leakage of the plasma 40 to the exhaust region 85 is inversely proportional to an exhaust efficiency of the processing gas inside a processing region in the processing region 84. And, as shown in FIG. 15, if a diameter of the gas passage hole 86a is small, the leakage of the charged particle is prevented, resulting in preventing the leakage of the plasma 40. However, the neutral gas particle 41 is not allowed to penetrate through, so that the processing gas inside the processing region 84 cannot be exhausted. On the other hand, if a diameter of the gas passage hole 86a is large, as shown in FIG. 16, the leakage of the plasma 40 to the exhaust region 85 cannot be prevented since there is a difficulty in keeping equipotential surfaces of the sheath field 44 in parallel to a processing-region surface 20a of the separator 86.

For allowing the neutral gas particle 41 to penetrate through and keeping the equipotential surfaces of the sheath field 44 in parallel to the processing-region surface 20a of the separator 86, as shown in FIG. 14, a diameter of the gas passage hole 86a of the separator 86 must be set within a proper range.

However, the proper range in the diameter of the gas passage hole 86a shown in FIG. 14 is too narrow and varies depending on a condition of the plasma 40, so that the diameter of the gas passage hole 86a cannot be set properly and it is difficult to reliably exhaust the processing gas inside the processing region and at the same time securely suppress the leakage of the plasma.

An object of the present invention is to provide a plasma processing device and a baffle plate thereof capable of improving an exhaust efficiency of a processing gas in a processing region and certainly suppressing a leakage of a plasma.

SUMMARY OF THE INVENTION

For achieving the object, in accordance with a first embodiment of the present invention, there is provided a plasma processing device including: a processing container; a separating unit for dividing an inside of the processing container into a processing region and an exhaust region, wherein a processing gas is introduced into the processing region and an object to be processed is processed therein, and wherein the processing gas supplied is exhausted to the exhaust region; and a discharging unit for discharging in the processing region to produce a plasma formed of charged particles and a neutral gas particle by ionizing the processing gas supplied, wherein the separating unit separates an average moving direction of the neutral gas particle from those of the charged particles in the vicinity of corresponding separating unit.

In the first embodiment, it is preferred that the separating unit contains: an opening through which the neutral gas particle passes; a non-conductive portion in a processing region facing surface, which faces the processing region; and a conductive portion in a gas flow facing surface, which faces a flow of the processing gas exhausted to the exhaust region from the processing region, wherein a predetermined voltage is applied to the conductive portion such that a potential of the gas flow facing surface is higher than that of a processing region facing surface.

In the first embodiment, it is preferred that the predetermined voltage is set such that a potential of the gas flow facing surface is higher than that of the plasma.

In the first embodiment, it is preferred that the predetermined voltage is set such that an electric energy, which is generated by a potential difference defined as a difference between a potential of the gas flow facing surface and that of the plasma, is not higher than a lowest energy needed for developing a discharging.

In the first embodiment, it is preferred that the separating unit is formed of a baffle member having curved waves such that curved portions are alternately formed in a processing region and in an exhaust region, and wherein the baffle member has a gas passage hole in each slope.

In the first embodiment, it is preferred that a distance between a plurality of protruded portions in the baffle member is set such that equipotential surfaces of a sheath field generated in the vicinity of the baffle member substantially do not break into a space formed by the plurality of the protruded portions facing a processing region side therebetween.

In the first embodiment, it is preferred that a gap between a plurality of curved portions in the processing region is substantially twice a thickness of a sheath formed in the vicinity of a baffle member or less.

In the first embodiment, it is preferred that the separating unit includes one baffle members disposed in the processing region and another baffle members disposed in the exhaust region, and one baffle members are misaligned with another baffle members when viewed from the processing region.

In the first embodiment, it is preferred that one baffle members and another baffle members shade the exhaust region when viewed from the processing region, and are disposed away from each other to form a space through which the neutral gas particle passes.

In the first embodiment, it is preferred that one baffle members and another baffle members are of a flat plate.

In the first embodiment, it is preferred that an area of another baffle members is substantially equal to or larger than a total area of gas passage holes corresponding to another baffle members, the gas passage holes being formed by a plurality of one baffle members therebetween, and a total area of another gas passage holes formed by a plurality of another baffle members therebetween is substantially equal to or larger than the total area of the gas passage holes.

In the first embodiment, it is preferred that one baffle members and another baffle members are of a blade shape.

In the first embodiment, it is preferred that each of one baffle members and another baffle members is an annular member having a plurality of through holes.

In the first embodiment, it is preferred that the plurality of the through holes are disposed in a concentric circle of the annular member.

In the first embodiment, it is preferred that the plurality of the through holes in one baffle members are misaligned with those in another baffle members when viewed from the processing region.

In the first embodiment, it is preferred that at least one of one baffle members and another baffle members contains: a non-conductive portion in a processing region facing surface, which faces the processing region; and a conductive portion in a gas flow facing surface, which faces a flow of the processing gas from the processing region to the exhaust region, wherein a predetermined voltage is applied to the conductive portion such that a potential of the gas flow facing surface is higher than that of a processing region facing surface.

In the first embodiment, it is preferred that the predetermined voltage is set such that a potential of the gas flow facing surface is higher than that of the plasma.

In the first embodiment, it is preferred that the predetermined voltage is set such that an electric energy, which is generated by a potential difference defined as a difference between a potential of the gas flow facing surface and that of the plasma, is not higher than a lowest energy needed for developing a discharging.

For achieving the object, in accordance with a second embodiment of the present invention, there is provided a baffle plate wherein a plasma formed of a neutral gas particle and charged particles, which are generated by ionizing a processing gas supplied into a processing container of a plasma processing device, has a contact with a processing region performing a processing therein on an object to be processed, and a path, through which the processing gas passes when being exhausted, is included, wherein an average moving direction of the neutral gas particle is separated from those of the charged particles in the vicinity of corresponding baffle plate.

In the second embodiment, it is preferred that the baffle plate includes: an opening through which the neutral gas particle passes; a non-conductive portion in a processing region contact surface having a contact with the processing region; and a conductive portion in a gas flow facing surface, which faces a flow of the processing gas exhausted, wherein a predetermined voltage is applied to the conductive portion such that a potential of the gas flow facing surface is higher than that of a processing region contact surface.

In the second embodiment, it is preferred that the predetermined voltage is set such that a potential of the gas flow facing surface is higher than that of the plasma.

In the second embodiment, it is preferred that the predetermined voltage is set such that an electric energy, which is generated by a potential difference defined as a difference between a potential of the gas flow facing surface and that of the plasma, is not higher than a lowest energy needed for starting the discharging.

In the second embodiment, it is preferred that waves having a plurality of protruded portions facing the processing region are shown and, a gas passage hole is formed in each slope of corresponding wave surface.

In the second embodiment, it is preferred that a distance between the plurality of the protruded portions is set such that equipotential surfaces of a sheath field generated in the vicinity of the baffle member substantially do not break into a space formed by the plurality of the protruded portions facing a processing region side therebetween.

In the second embodiment, it is preferred that a distance between the plurality of the protruded portions is substantially twice a thickness of a sheath formed in the vicinity of a baffle member or less, so that equipotential surfaces of a sheath field can be maintained substantially in parallel with a surface normal to a flow direction of a processing gas to be exhausted from the processing region.

In the second embodiment, it is preferred that the baffle plate includes: one baffle members disposed in the processing region; and another baffle members disposed in the exhaust region, wherein one baffle members are misaligned with another baffle members when viewed from the processing region.

In the second embodiment, it is preferred that one baffle members and another baffle members shade the exhaust region when viewed from the processing region, and are disposed away from each other to form a space through which the neutral gas particle passes.

In the second embodiment, it is preferred that one baffle members and another baffle members are of a flat plate.

In the second embodiment, it is preferred that an area of another baffle members is substantially equal to or larger than a total area of gas passage holes corresponding to another baffle members, the gas passage holes being formed by a plurality of one baffle members therebetween, and a total area of another gas passage holes formed by a plurality of another baffle members therebetween is substantially equal to or larger than the total area of the gas passage holes.

In the second embodiment, it is preferred that one baffle members and another baffle members are of a blade shape.

In the second embodiment, it is preferred that each of one baffle members and another baffle members is an annular member having a plurality of through holes.

In the second embodiment, it is preferred that the plurality of the through holes are disposed in a concentric circle of the annular member.

In the second embodiment, it is preferred that the plurality of the through holes in one baffle members are misaligned with those in another baffle members when viewed from the processing region.

In the second embodiment, it is preferred that at least one of one baffle members and another baffle members contains: a non-conductive portion in a processing region contact surface, which faces the processing region; and a conductive portion in a gas flow facing surface, which faces a flow of the processing gas exhausted, wherein a predetermined voltage is applied to the conductive portion such that a potential of the gas flow facing surface is higher than that of a processing region contact surface.

In the second embodiment, it is preferred that the predetermined voltage is set such that a potential of the gas flow facing surface is higher than that of the plasma.

In the second embodiment, it is preferred that the predetermined voltage is set such that an electric energy, which is generated by a potential difference defined as a difference between a potential of the gas flow facing surface and that of the plasma, is not higher than a lowest energy needed for developing a discharging.

DETAILED DESCRIPTION OF THE PREFERRED EMBODIMENT

Hereinafter, configurations and operations of a plasma processing device in accordance with preferred embodiments of the present invention will be described.

Figure 1:
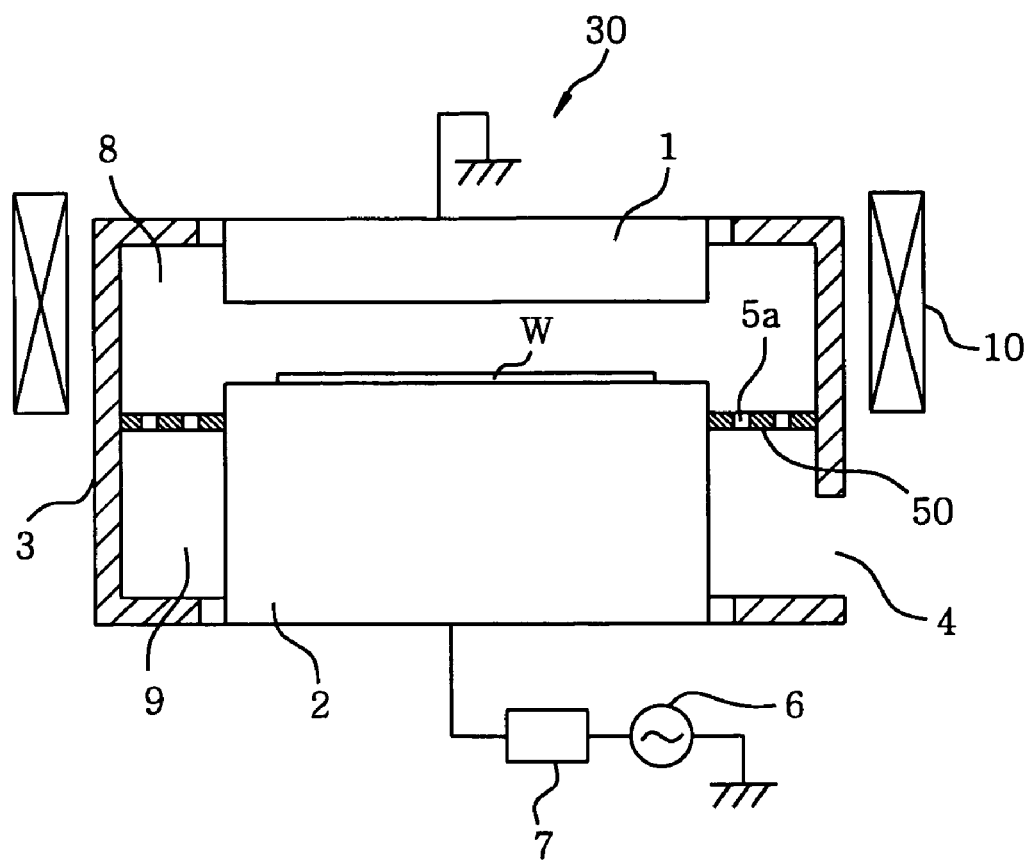
FIG. 1 offers a view for showing a schematic configuration of a plasma processing apparatus in accordance with a first embodiment of the present invention.

FIG. 1 is a view for showing a schematic configuration of a plasma processing device in accordance with a first embodiment of the present invention.

As shown in FIG. 1, a magnetron type parallel plate plasma processing device 30 includes a cylindrical processing container 3 that contains an upper electrode 1 and a cylindrical lower electrode 2 in a top part and a lower part thereof, respectively, wherein the lower electrode 2 has a mounting surface in a top part thereof, on which a semiconductor wafer W as a substrate to be processed is mounted. Between the upper electrode 1 and the lower electrode 2, a gap for performing a plasma processing on the semiconductor wafer W is formed. Further, the lower electrode 2 is disposed substantially parallel to the upper electrode 1.

Still further, the processing container 3 includes a separator 50 (separating unit, baffle plate) for dividing an inside thereof into a processing region 8 and an exhaust region 9, in the vicinity of the lower electrode 2 or in a position lower than the top part of the lower electrode 2. The upper electrode 1 contains a gas inlet hole (not shown) for introducing a processing gas into the process region 8. The separator 50 has a plurality of gas passage holes 5a penetrating through the processing region 8 and the exhaust region 9 such that the processing gas inside the processing region 8 is exhausted to the exhaust region 9. The processing container 3 includes in a lower part thereof a gas exhaust port 4 for depressurizing and exhausting the processing region 8 through the exhaust region 9, which is connected to a vacuum pump (not shown).

While the upper electrode 1 is grounded, the lower electrode is connected to at least one high frequency power source 6 via a matching circuit 7. Around an upper part of the processing container 3, an annular permanent magnet 10 is disposed.

In the plasma processing device 30, the processing region 8 into which the processing gas is introduced through the gas inlet hole formed in the upper electrode 1 is depressurized and exhausted through the gas passage holes 5a and the exhaust region 9 by the vacuum pump to thereby be controlled to be maintained at a predetermined pressure. Further, the high frequency power source 6 induces a high frequency electric field in the processing region 8 between the upper and the lower electrode 1 and 2, and the permanent magnet 10 generates a parallel magnetic field normal to the high frequency electric field. By the high frequency electric field and the parallel magnetic field, being normal to each other, a high-density plasma is produced.

Figure 2:
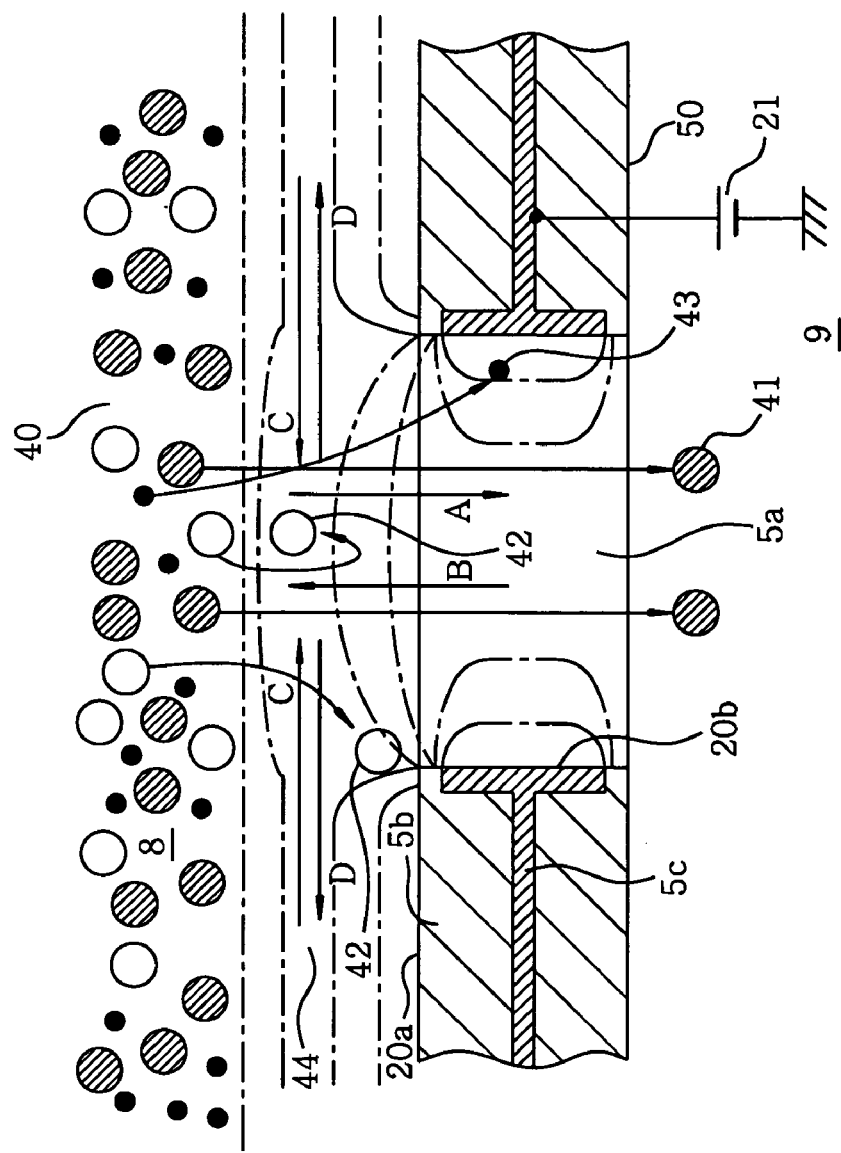
FIG. 2 shows a cross sectional view of a separator in FIG. 1.

FIG. 2 is a cross sectional view of the separator 50 in FIG. 1.

As shown in FIG. 2, the separator 50 is made of a non-conductive member 5b, and a conductive member 5c is disposed in a gas passage-side surface 20b facing the gas passage hole 5a. As a result, a processing-region surface 20a facing the processing region 8 has a non-conductive property and the gas passage-side surface 20b facing the gas passage hole 5a has a conductive property.

To the conductive member 5c, a predetermined voltage V is applied from a power supply 21 such that the voltage at the gas passage-side surface 20b is higher than that at the processing-region surface 20a. It is preferred that the predetermined voltage V is chosen such that the voltage at the gas passage side surface 20b is higher than that of the plasma 40, and an electric energy is not higher than a lowest energy needed to develop a discharge in the processing gas inside the processing region, wherein the electric energy is generated by a potential difference given by a difference between a potential at the gas passage-side surface 20b and that of the plasma 40.

The lowest energy needed to develop a discharge in the processing gas inside the processing region is of a metastable level of Ar, i.e., 11.53 eV in case where the processing gas is formed of $C_4F_8$, $O_2$, and Ar. Further, in case where the processing gas is formed of HBr and $O_2$, the lowest energy is given by an ionization energy of HBr, i.e., 11.71 eV since the ionization energy of HBr, i.e., 11.71 eV is smaller than that of $O_2$, i.e., 12.07 eV.

By such a configuration, the positively charged particles 42 moving towards the exhaust region 9 from the processing region 8 are impeded by the sheath field 44 to thereby be pushed back towards the processing region 8 or paths thereof are turned towards the processing-region surface 20a of the separator 50, and the negative particles 43 are turned towards the gas passage-side surface 20b, since the sheath field 44 generated in the vicinity of the separator 50 has positive slopes in A and C directions, and negative slopes in B and D directions. Meanwhile, the neutral gas particle 41 moves to the exhaust region 9 via the gas passage hole 5a without being influenced by the sheath field 44. As mentioned above, the separator 50 does not suppress a movement of the neutral gas particle but suppresses movements of charged particles, i.e., the negatively charged and the positively charged particle 42 and 43, to thereby separate the neutral gas particle 41 from the charged particles.

In accordance with the first embodiment, the separator 50 is configured to separate the neutral gas particle 41 from the charged particles, so that an average moving direction of the neutral gas particles 41 can be separated from those of the charged particles. Further, an exhaust efficiency of the processing gas inside the processing region can be enhanced and the leakage of the plasma 40 can be surely suppressed, so that erosion of inner wall components of the manifold part (exhaust region 9) is suppressed to thereby prolong a lifetime of the plasma processing device 30. At the same time, an inner pressure of the processing region 8 can be easily controlled.

In the first embodiment, the separator 50 is formed of the non-conductive member 5b and the conductive member 5c, but it is not limited thereto. It can be configured such that the processing-region surface 20a is non-conductive and the gas passage-side surface 20b is conductive, and, e.g., the separator is made of a metal such as aluminum or the like of a conductive material and the processing-region surface 20a is coated with a non-conductive material, e.g., yttria or polyimide organic compound or the like, which differs from an oxide aluminum and a metal such as aluminum or the like.

Further, in the first embodiment, the electric energy generated by a potential difference, which is defined as a difference between a potential of the gas passage-side surface 20b and that of the plasma 40, is prescribed by using a lowest energy needed to develop a discharge in the processing gas inside the processing region as a reference, but the smallest value out of ionization energies of the processing gas inside the processing region may be used as the reference.

Figure 3:
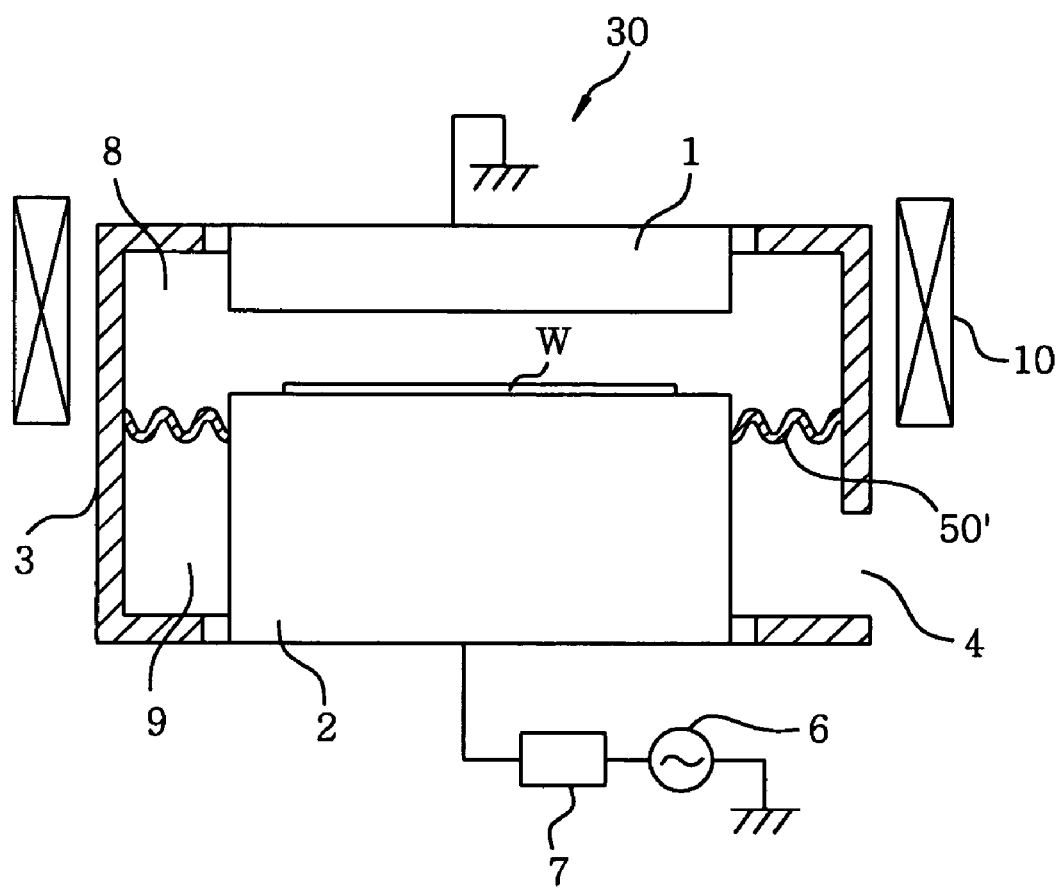
FIG. 3 explains a view for showing a schematic configuration of a plasma processing apparatus in accordance with a second embodiment of the present invention.

FIG. 3 shows a schematic configuration of a plasma processing device in accordance with a second embodiment of the present invention.

Since a configuration of the second embodiment is basically same as that of the first embodiment, like reference numerals will be assigned to like parts having substantially same functions and redundant description thereof will be omitted. Hereinafter, other parts will be explained only.

As shown in FIG. 3, a magnetron type parallel plate plasma processing device 30 includes a wavy baffle member 50' (separating unit, baffle plate) for dividing an inside of a processing container 3 into a processing region 8 and an exhaust region 9.

Figure 4:
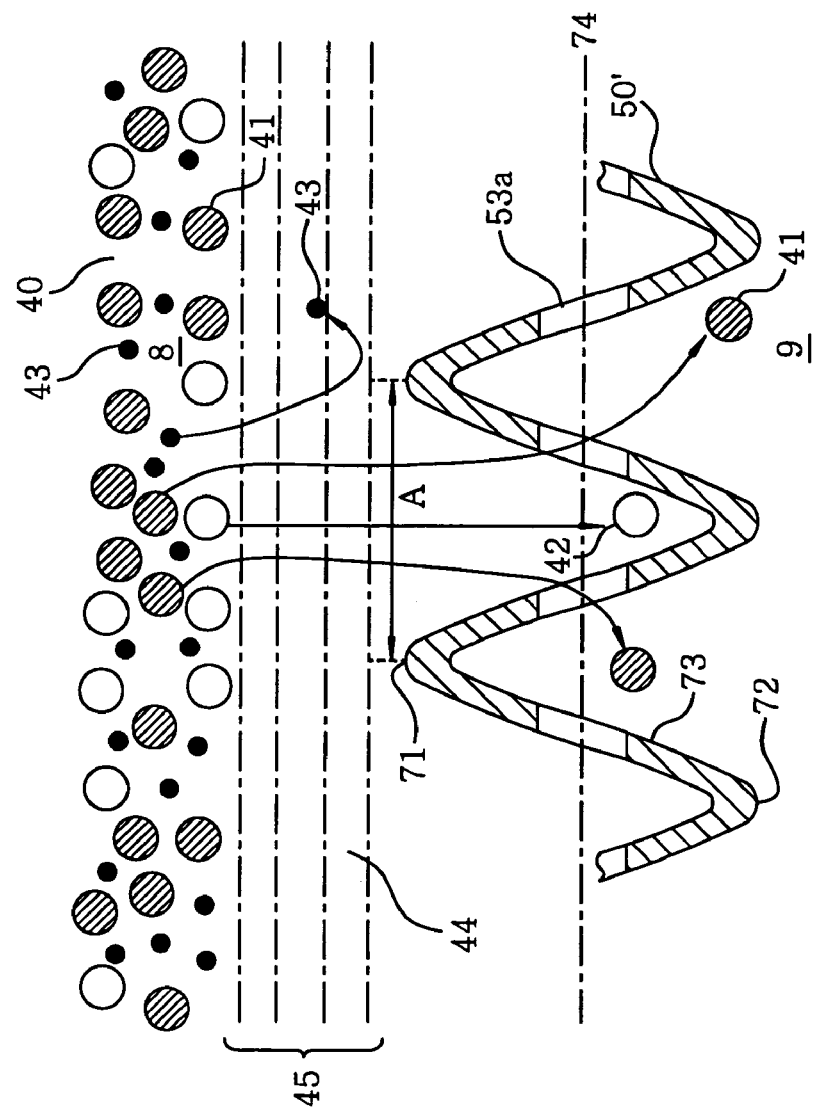
FIG. 4 sets forth a cross sectional view of a wavy baffle member in FIG. 3.

FIG. 4 is a cross sectional view of the wavy baffle member 50' in FIG. 3.

As shown in FIG. 4, the wavy baffle member 50' is of a curved wave shape such that curved portions 71 and 72 thereof are alternately formed in the processing region 8 and in the exhaust region 9. The wavy baffle member 50' has in each of slopes 73 a gas passage hole 53a normal to the flow direction of the processing gas inside the processing region being exhausted.

For horizontally keeping the equipotential surfaces of the sheath field 44, it is preferred that a period A between the curved portions 71 is substantially twice the thickness of the sheath 45 or less.

The wavy baffle member 50' maintains the equipotential surfaces of the sheath field 44 in parallel with a surface 74 normal to the flow direction of the processing gas to be exhausted inside the processing region and, at the same time, serves as a physical obstacle for suppressing the flow of the positively charged particle 42 and is responsible for adjusting conductance to the flow. Accordingly, the negatively charged particle 43 is impeded by the sheath field 44 and pushed back towards the plasma, and the positively charged particle 42 moves to the normal direction to the wavy baffle member 50' to thereby be trapped in the curved portion 72. On the other hand, the neutral gas particle 41 freely changes the moving direction without being influenced by the sheath field 44 and thus passes through the gas passage hole 53a. As described above, the wavy baffle member 50' does not suppress the movement of the neutral gas particle but suppresses movements of charged particles, i.e., the positively charged and the negatively charged particle 42 and 43, to thereby separate the neutral gas particle from the charged particles.

In accordance with the second embodiment, the wavy baffle member 50' is configured to separate the neutral gas particle 41 from the charged particles, so that an average moving direction of the neutral gas particle 41 can be separated from those of the charged particles. Further, an exhaust efficiency of the processing gas inside the processing region can be enhanced and the leakage of the plasma 40 can be surely suppressed, so that erosion of inner wall components of a manifold part is suppressed to thereby prolong a lifetime of the plasma processing device 30 and, at the same time, an inner pressure of the processing region 8 can be easily controlled.

Figure 5:
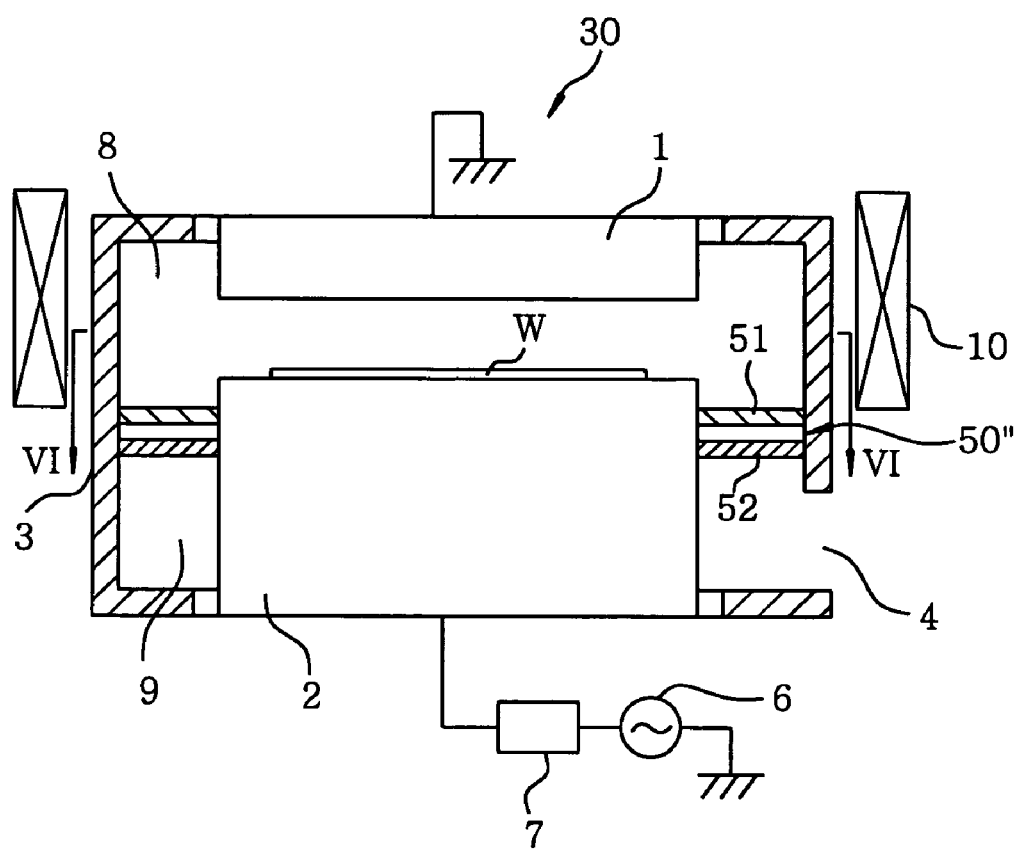
FIG. 5 presents a view for showing a schematic configuration of a plasma processing apparatus in accordance with a third embodiment of the present invention.

FIG. 5 shows a schematic configuration of a plasma processing device in accordance with a third embodiment of the present invention.

Since a configuration of the third embodiment is basically same as that of the first embodiment, like reference numerals will be assigned to like parts having substantially same functions and redundant description thereof will be omitted. Hereinafter, other parts will be explained only.

Figure 6:
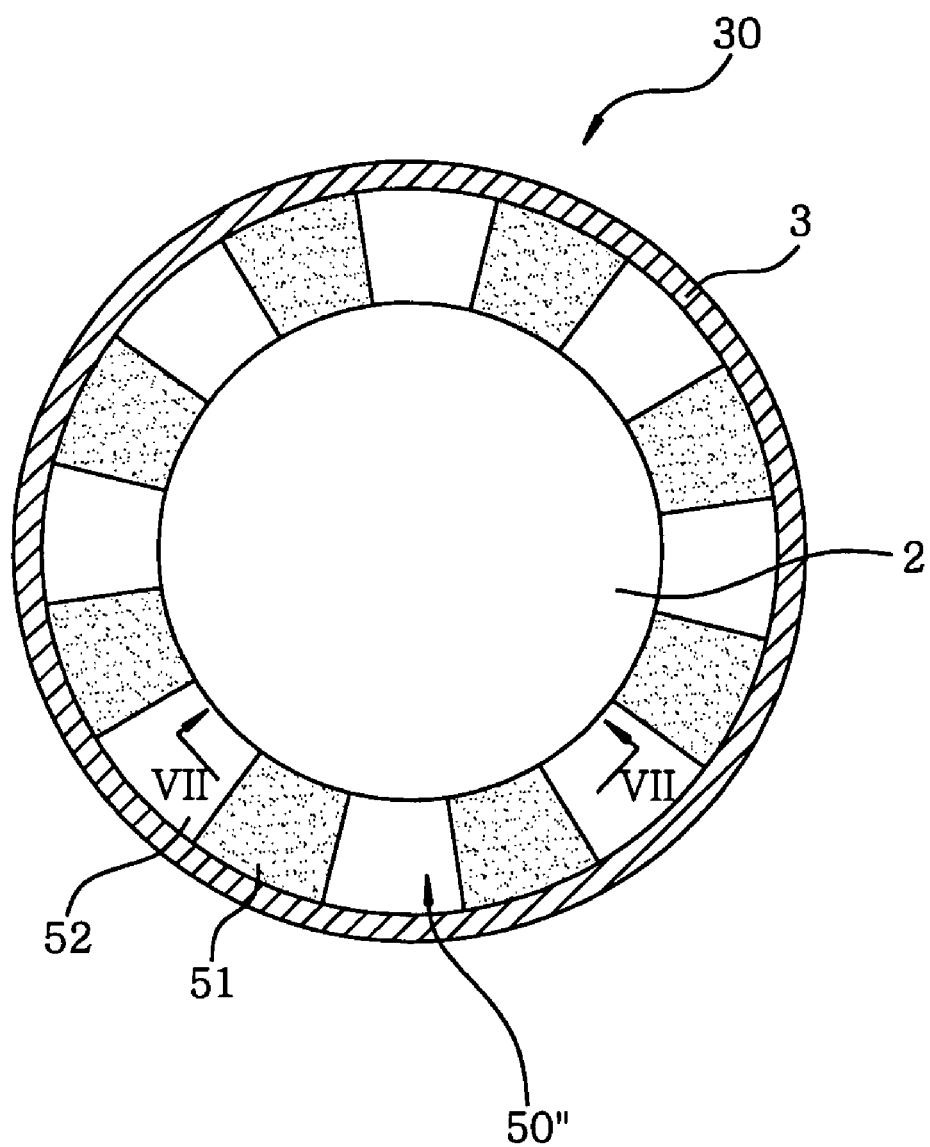
FIG. 6 provides a cross sectional view taken along VI—VI line in FIG. 5.

As shown in FIG. 5, a magnetron type parallel plate plasma processing device 30 includes a multi-layered baffle member 50" (separating unit, baffle plate) for dividing an inside of a processing container 3 into a processing region 8 and an exhaust region 9. As shown in FIG. 6, the multi-layered baffle member 50" contains a plurality of first blade shaped baffle plates 51 provided in an outer periphery of a lower electrode 2 with equiangular spaces therebetween, and a plurality of second blade shaped baffle plates 52 provided in an inner periphery of the processing container 3 with equiangular spaces therebetween. In FIG. 5, the first and the second baffle plates 51 and 52 are installed in the processing region 8 and the exhaust region 9, respectively, but an arrangement thereof may be the opposite.

The first and the second baffle plates 51 and 52 are alternately arranged side by side to form parallel serrated patterns when viewed from radial directions of the processing container 3, and disposed to shield the exhaust region 9 when viewed from the processing region 8 side. Further, the first and the second baffle plates 51 and 52 are disposed away from each other to have a gap therebetween in a direction towards the exhaust region 9 from the processing region 8, the gap being large enough to let the neutral gas particles 41 pass therethrough.

Figure 7:
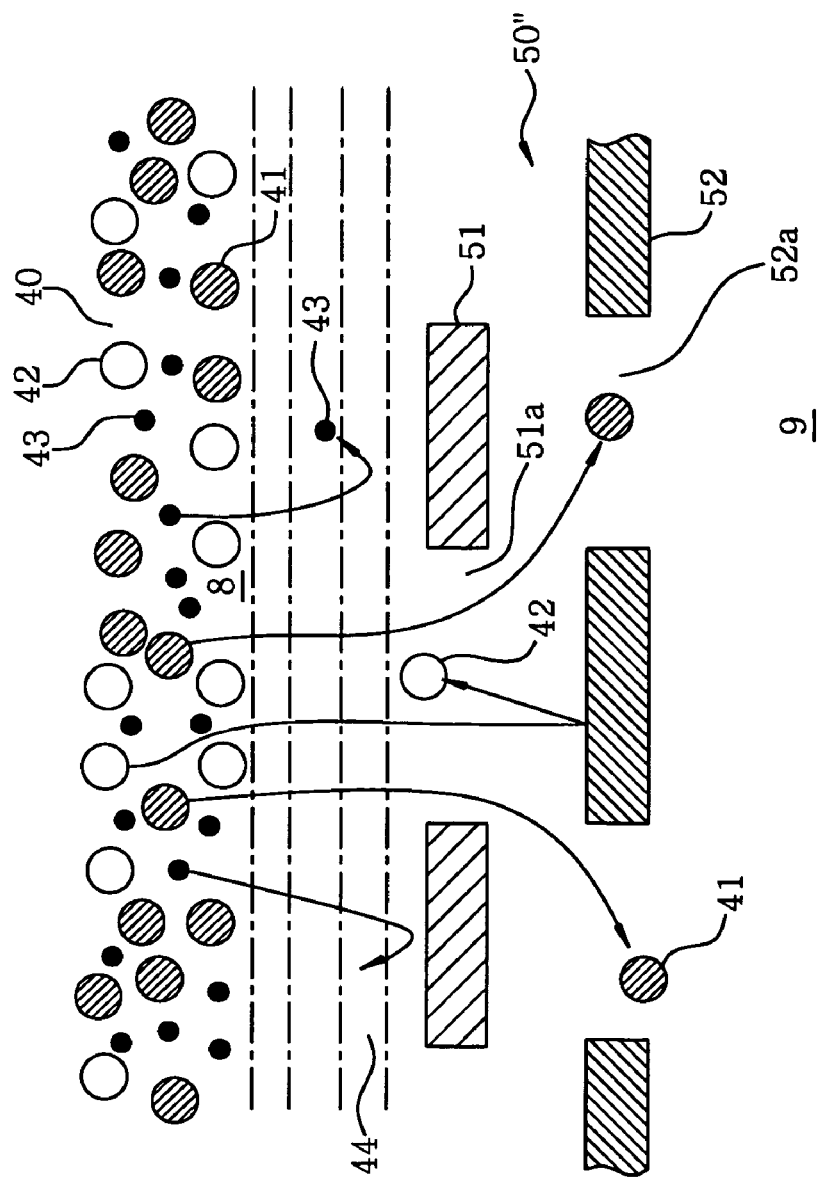
FIG. 7 describes a cross sectional view taken along VII—VII line in FIG. 6.

FIG. 7 is a cross sectional view taken along VII—VII line of FIG. 6.

As shown in FIG. 7, the multi-layered baffle member 50" contains gas passages 51a and 52a (gas through ports) formed by a plurality of the first and the second baffle plates 51 and 52 therebetween, respectively. Further, in order to maintain equipotential surfaces of a sheath field 44 substantially in parallel with the first and the second baffle plates 51 and 52, the gap therebetween is set accordingly.

Further, it is preferred that a total area of the second baffle plates 52 is substantially equal to or larger than a total opening area of the gas passages 51a in the first baffle plates 51, which face the second baffle plates 52, and a total opening area of the gas passages 52a between the second baffle plates 52 is substantially equal to or larger than the total opening area of the gas passages 51a in the first baffle plates 51, which face the second baffle plates 52.

By such a configuration, the multi-layered baffle member 50" maintains the equipotential surfaces of the sheath field 44 substantially in parallel with the first and the second baffle plates 51 and 52, and at the same time, serves as a physical obstacle for suppressing a flow of positively charged particles 42. Accordingly, a negatively charged particle 43 is impeded by the sheath field 44 to thereby be pushed back towards the plasma 40, and the positively charged particle 42 moves to the normal direction to the first and the second baffle plates 51 and 52 to thereby be bounced back therefrom. Meanwhile, the neutral gas particle 41 freely changes a moving direction thereof without being influenced by the sheath field 44 and thus passes through the gas passage holes 51a and 52a. As described above, the multi-layered baffle member 50" does not suppress the movement of the neutral gas particle 41 while bounces back charged particles, i.e., the positively charged particle 42 and the negatively charged particle 43, to thereby separate the neutral gas particle 41 from the charged particles.

Further, same as in the aforementioned first embodiment, each of the first and the second baffle plates 51 and 52 may have a non-conductive member and a conductive member such that a processing-region surface facing the processing region 8 has a non-conductive property, and gas passage-side surfaces facing the gas passages 51a and 52a have a conductive property.

In accordance with the third embodiment, the multi-layered baffle member 50" is configured to separate the neutral gas particle 41 from charged particles, so that an average moving direction of the neutral gas particles 41 can be separated from those of the charged particles. Further, an exhaust efficiency of the processing gas inside the processing region can be enhanced and the leakage of the plasma 40 can be surely suppressed, so that erosion of inner wall components of a manifold part is suppressed to thereby prolong a lifetime of the plasma processing device 30 and, at the same time, an inner pressure of the processing region 8 can be easily controlled.

Figure 8:
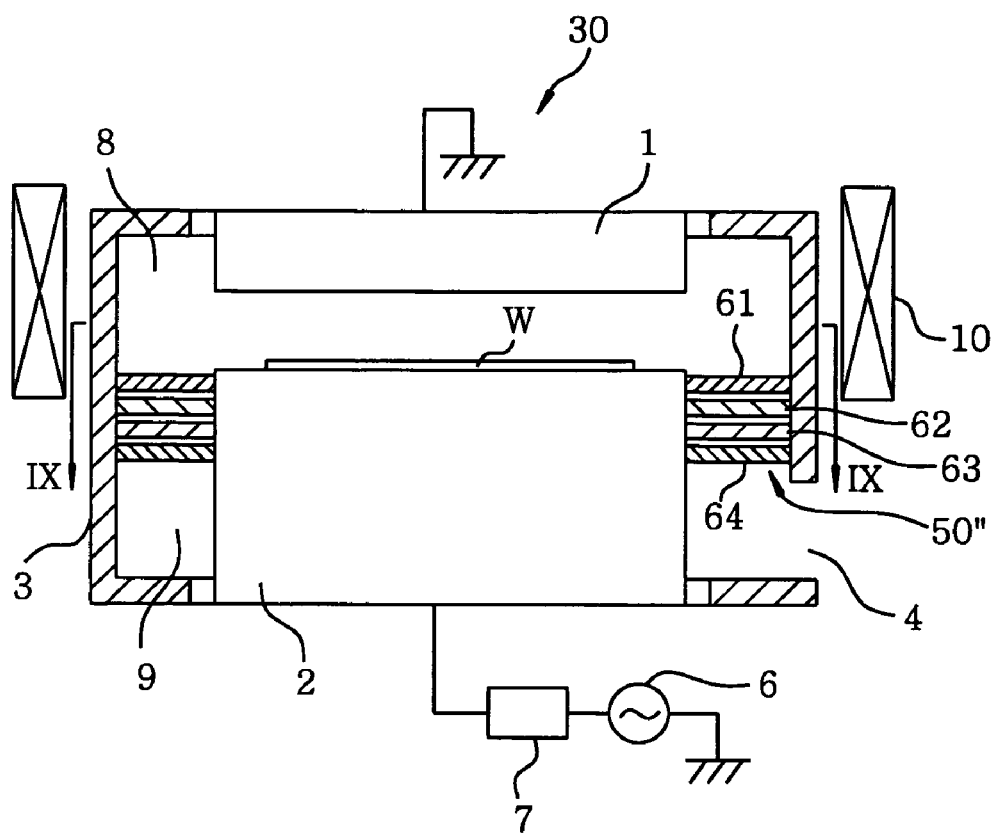
FIG. 8 depicts a view for showing a schematic configuration of a modified example of the plasma processing apparatus of FIG. 5.
Figure 9:
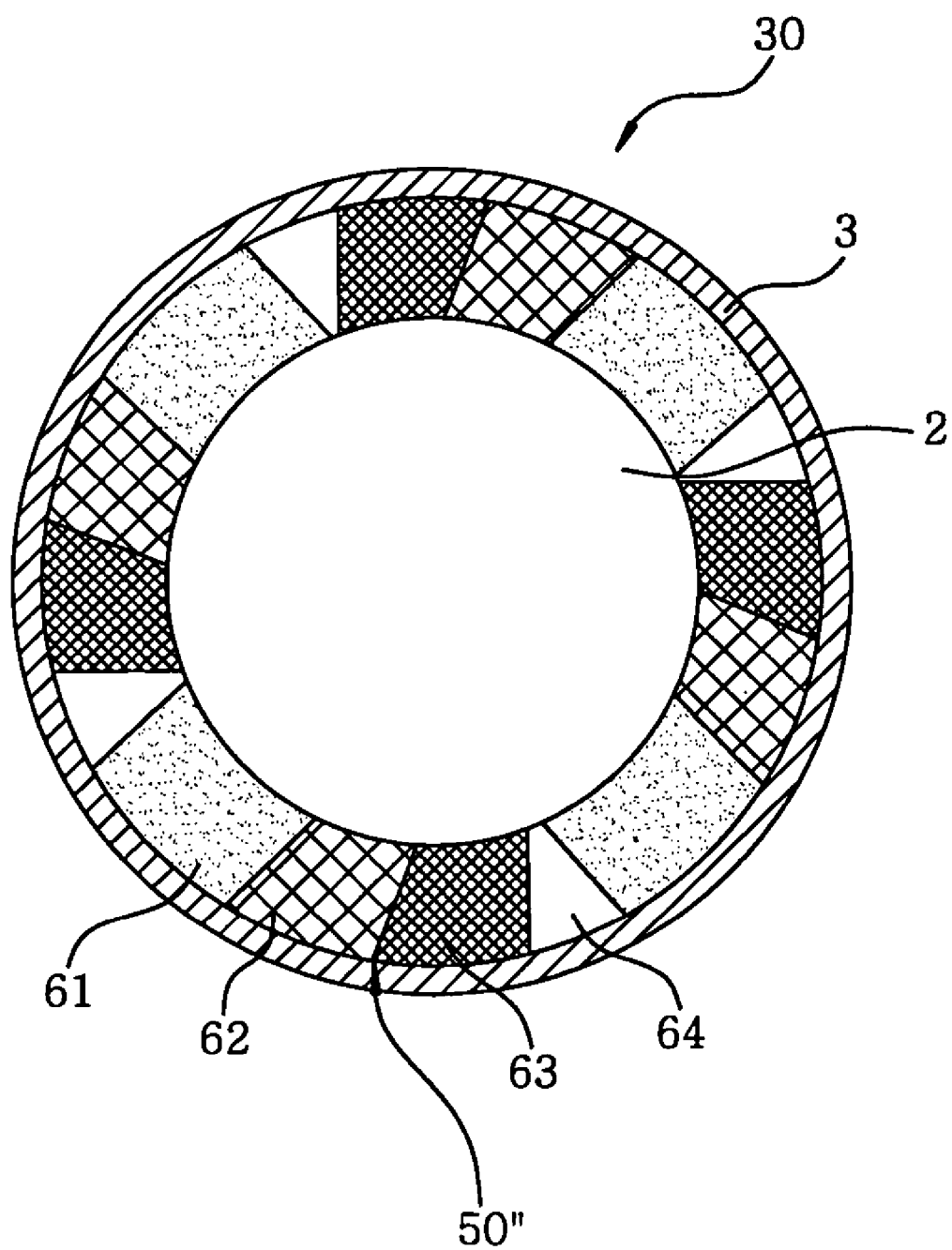
FIG. 9 describes a cross sectional view taken along IX—IX line in FIG. 8.

In the third embodiment, the multi-layered baffle member 50" is formed of two rows of the first and the second baffle plates 51 and 52, but it is not limited thereto. As shown in FIGS. 8 and 9, it can be configured such that the multi-layered baffle member 50" is formed of four rows of blade shaped baffle plates 61 to 64 provided in an outer periphery of the lower electrode 2 with equiangular spaces therebetween or provided in an inner periphery of the processing container 3 with equiangular spaces therebetween, and preferably, is formed of at least two rows or more.

In the third embodiment, the first and the second baffle plates 51 and 52 and the like are of a blade shape, but it is not limited thereto.

Figure 10:
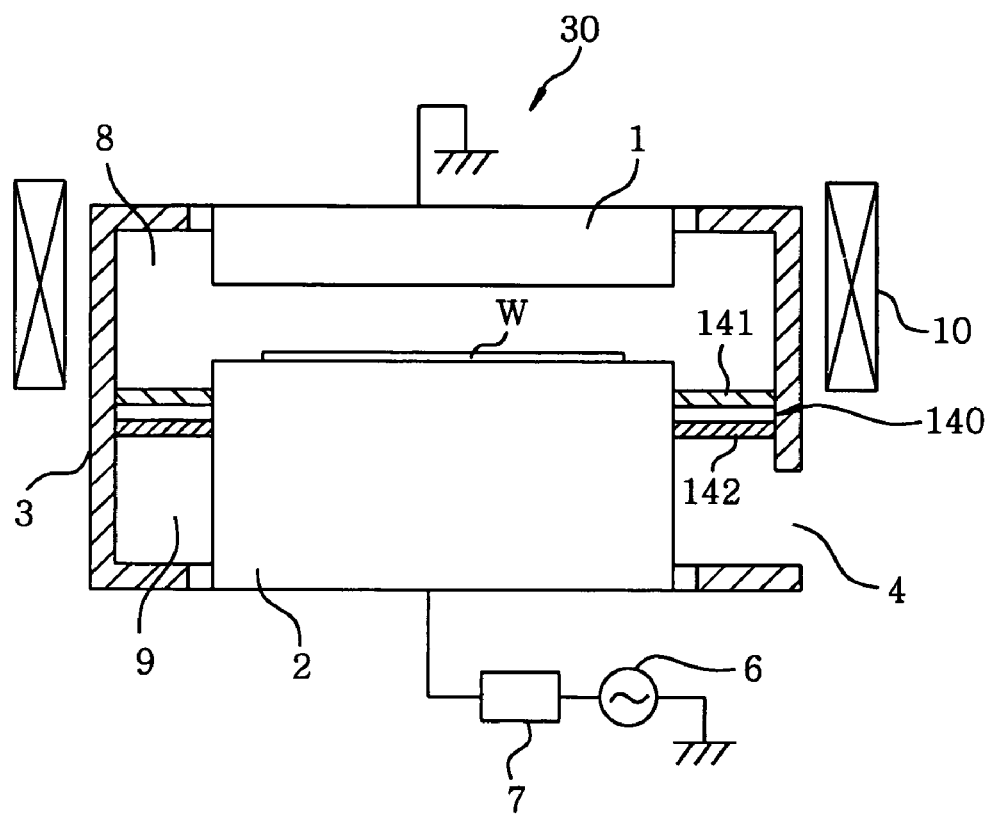
FIG. 10 offers a view for showing a schematic configuration of a plasma processing apparatus in accordance with a fourth embodiment of the present invention.

FIG. 10 shows a schematic configuration of a plasma processing device in accordance with a fourth embodiment of the present invention.

Since a configuration of the fourth embodiment is basically same as that of the first embodiment, like reference numerals will be assigned to like parts having substantially same functions and redundant description thereof will be omitted. Hereinafter, other parts will be explained only.

Figure 11A:
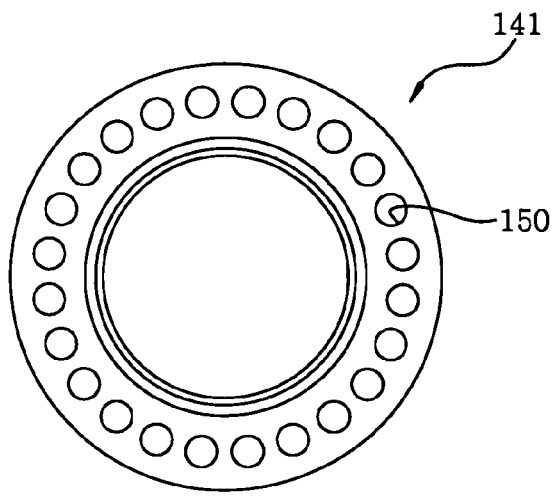
FIG. 11A shows a schematic configuration of a first baffle plate forming a multi-layered baffle member in FIG. 10.
Figure 11B:
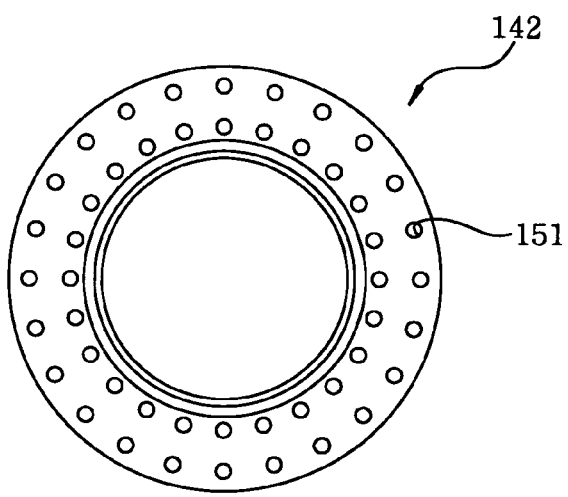
FIG. 11B describes a schematic configuration of a second baffle plate forming a multi-layered baffle member in FIG. 10.
Figure 11C:
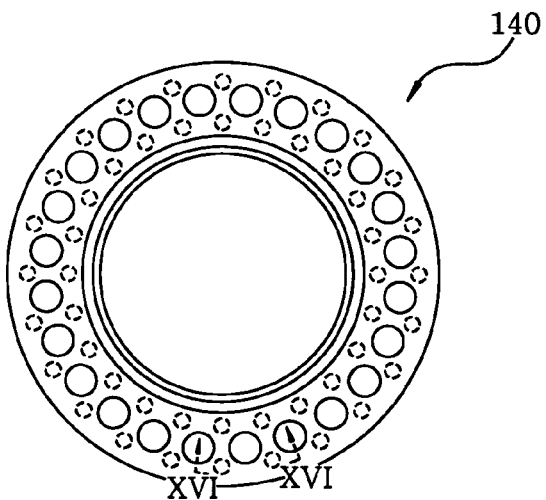
FIG. 11C presents a schematic configuration of a multi-layered baffle member in FIG. 10.

As shown in FIG. 10, a magnetron type parallel plate plasma processing device 30 includes a multi-layered baffle member 140 (separating unit, baffle plate) for dividing an inside of a processing container 3 into a processing region 8 and an exhaust region 9. The multi-layered baffle member 140 has a ring shaped first baffle plate 141 (FIG. 11A) in which a plurality of through holes 150 are punched, and a ring shaped second baffle plate 142 (FIG. 11B) in which a plurality of through holes 151 are punched. In the first baffle plate 141, a plurality of the through holes 150 are arranged at equiangular spaces therebetween on a same circumference to thereby form one line of the through holes, and in the second baffle plate 142, a plurality of the through holes 151 are arranged at equiangular spaces therebetween on two circumferences to thereby form two lines of the through holes.

Conventionally, the first and the second baffle plates 141 and 142 are disposed in the processing region 8 and the exhaust region 9, respectively, but an arrangement thereof may be reversed. However, in any arrangements, relative positions of the first and the second baffle plates 141 and 142 in the circumferential directions thereof are adjusted such that the through holes 150 and 151 are not connected with each other, when viewing the multi-layered baffle member 140 from the processing region 8 (FIG. 1C). Further, a space of 1 mm or greater between the first and the second baffle plates 141 and 142 in the direction towards the exhaust region 9 from the processing region 8 is such that a neutral gas particle 41 can pass therethrough.

Figure 12:
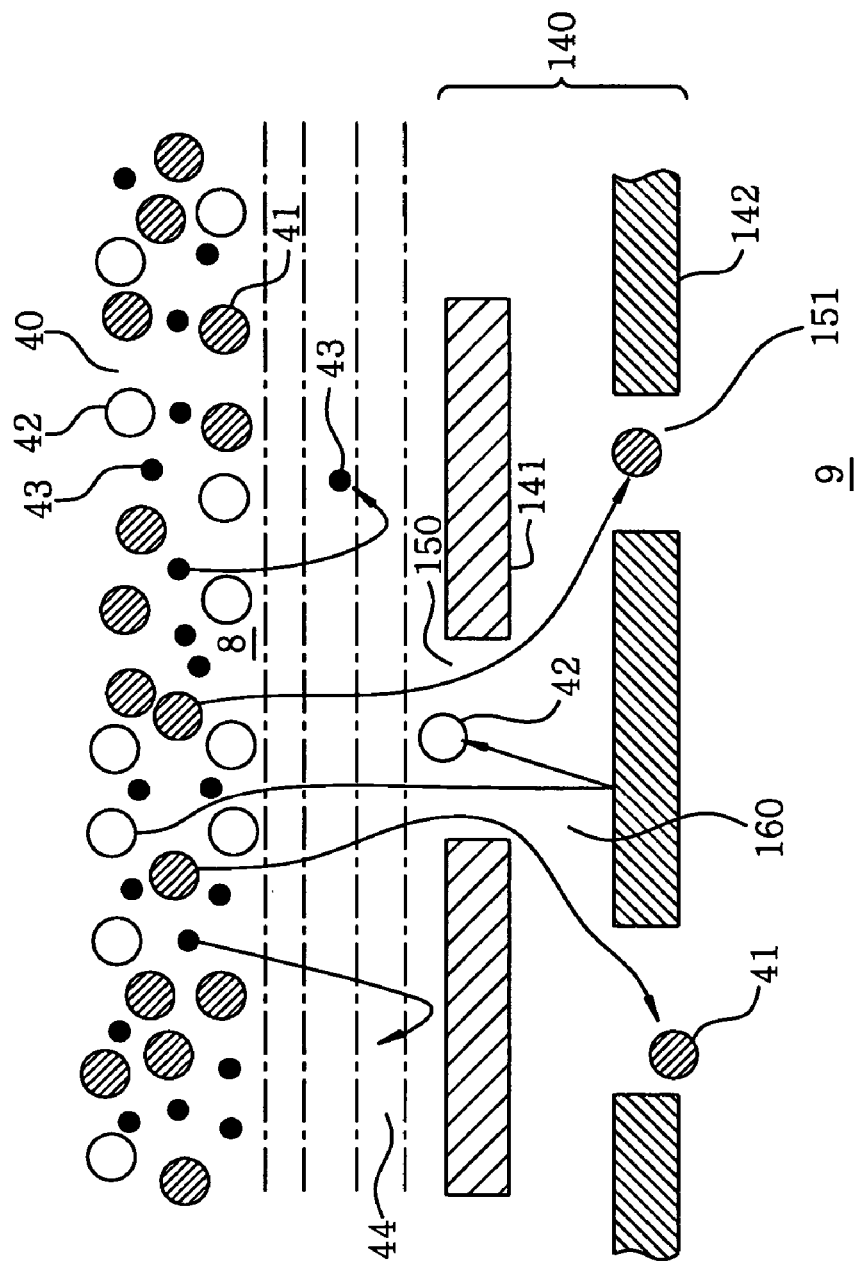
FIG. 12 provides a cross sectional view taken along XVI—XVI line in FIG. 1C.
Figure 13:
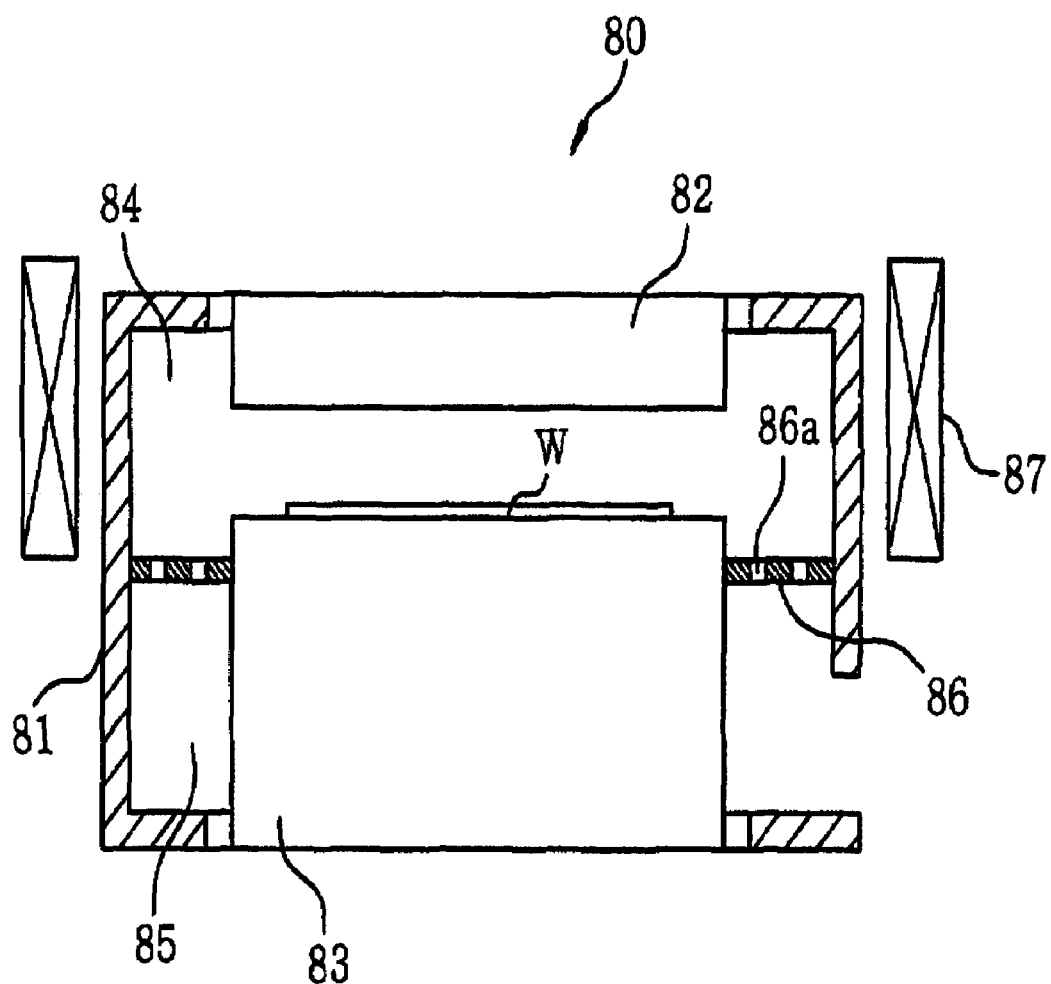
FIG. 13 offers a schematic configuration of a magnetron type parallel plate plasma processing apparatus of a conventional art.
Figure 14:
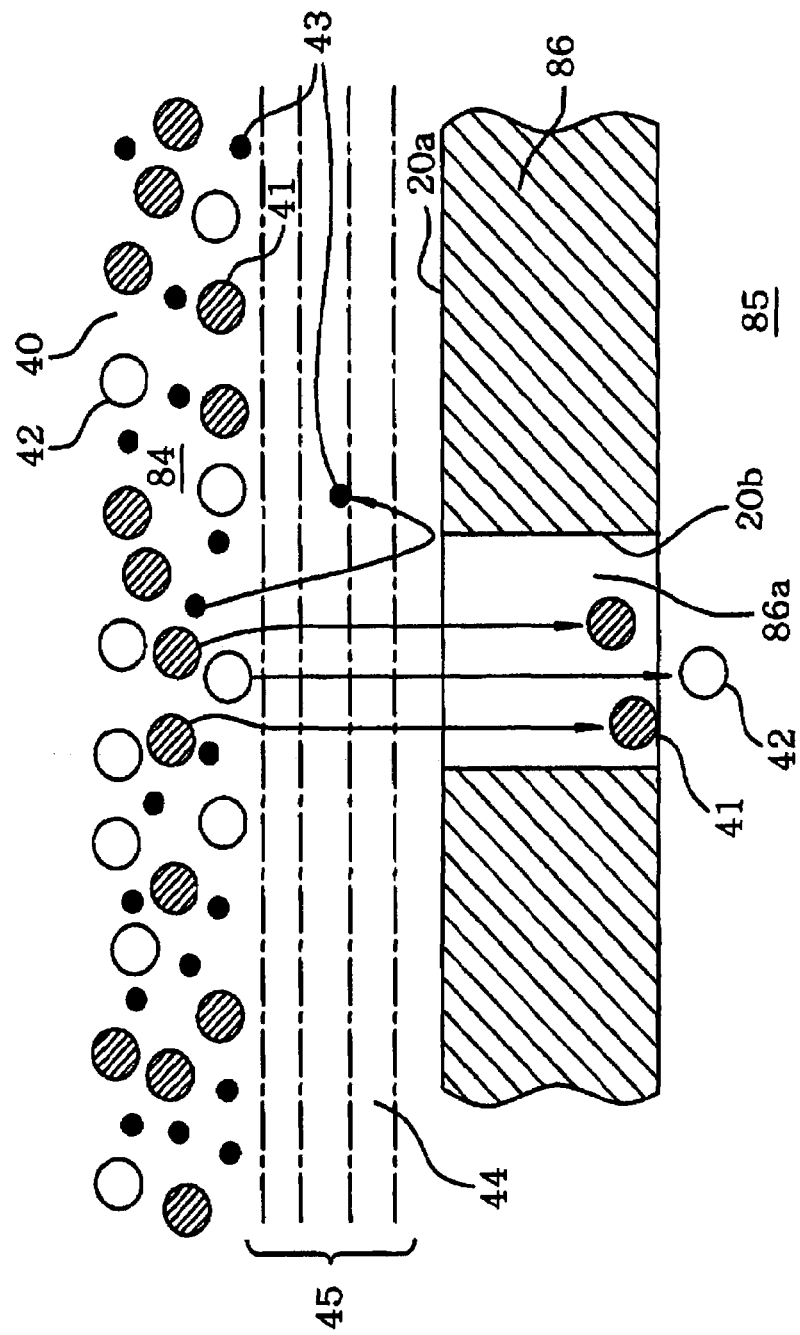
FIG. 14 is a view for explaining a processing gas flow inside a processing region in the vicinity of a gas passing hole of a separator 86 in FIG. 13.
Figure 15:
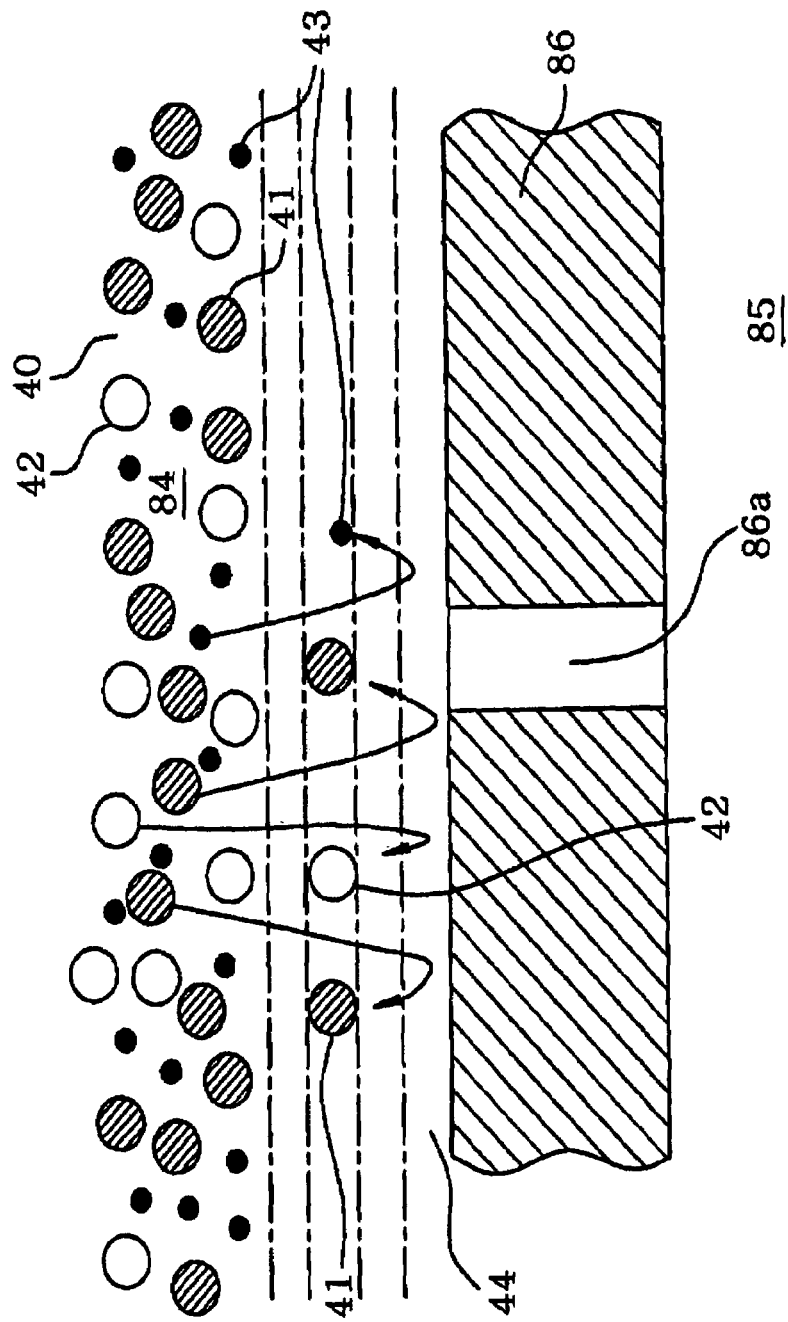
FIG. 15 shows a view for explaining a processing gas flow inside a processing region in the vicinity of a gas passing hole of a separator 86 in FIG. 13.
Figure 16:
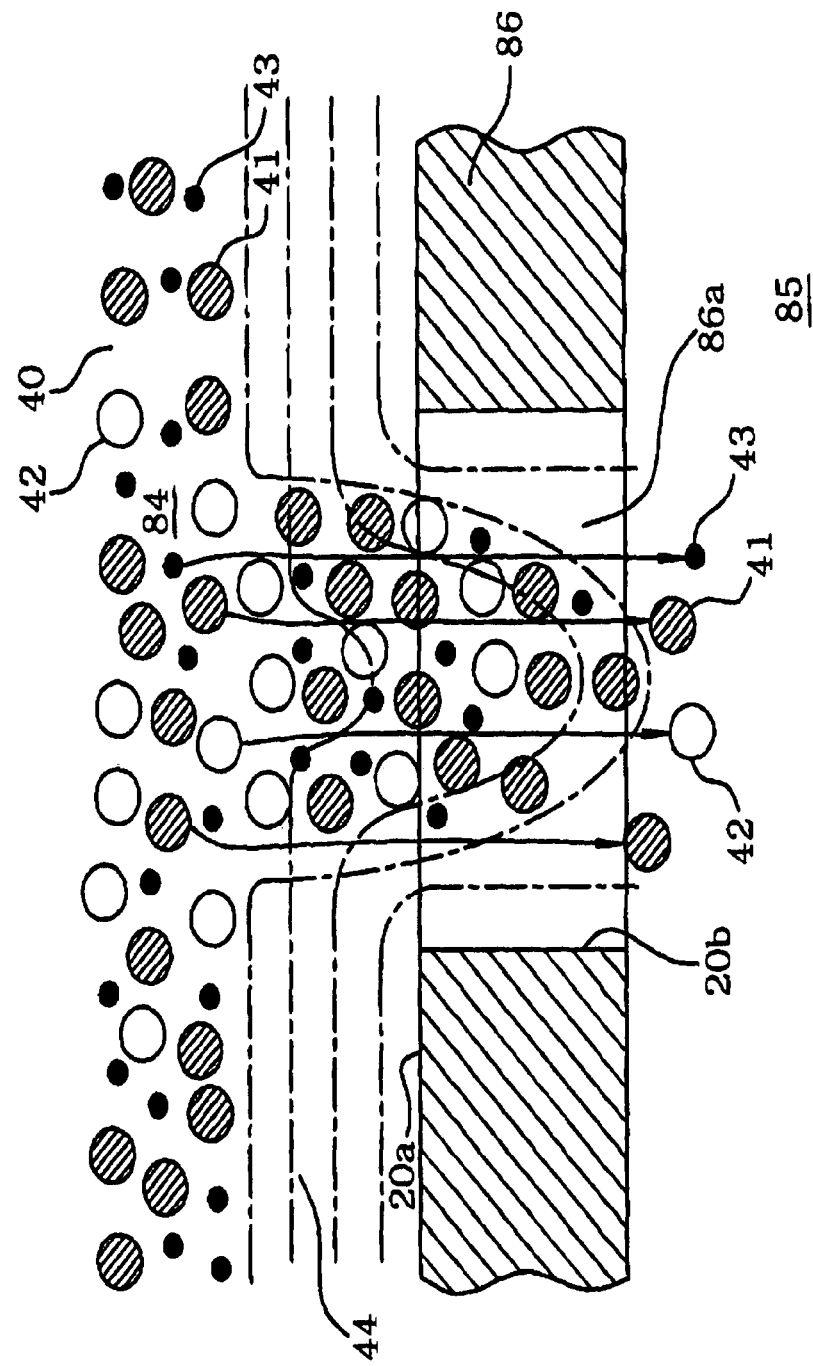
FIG. 16 presents a view for explaining a processing gas flow inside a processing region in the vicinity of a gas passing hole of a separator 86 in FIG. 13.

FIG. 12 is a cross sectional view taken along XVI—XVI line of FIG. 1C.

As shown in FIG. 12, the multi-layered baffle member 140 includes through holes 150, a space 160 intervening between the first and the second baffle plates 141 and 142, and through holes 151. As described above, the through holes 150 and 151 are misaligned from each other, viewed from the processing region 8, so that corresponding gas passage is curved.

Further, a hole diameter of each through hole 150 becomes φ 30 mm in order to maintain equipotential surfaces of a sheath field 44 substantially in parallel with the first baffle plates 141, and a hole diameter of each through hole 151 becomes φ 19 mm since an exhaust efficiency of the neutral gas particle 41 is maintained at a predetermined specific value or greater. Accordingly, the multi-layered baffle member 140 serves as a physical obstacle for suppressing flows of charged particles moving along a direction normal to the first and the second baffle plates 141 and 142, and at the same time, maintains the equipotential surfaces of the sheath field 44 substantially in parallel with the first baffle plates 141.

At this time, a force pushing to return towards the plasma 40 is exerted from the sheath field 44 on a negatively charged particle 43, and a force along a normal direction towards the first and the second baffle plates 141 and 142 is exerted from the sheath field 44 on a positively charged particle 42. Therefore, the positively charged particle 42 reaches the first baffle plates 141 or the second baffle plates 142, and is bounced back to the processing region 8 therefrom. On the other hand, the neutral gas particle 41 is not under any influence of the sheath field 44 to thereby freely change a moving direction in the vicinity of the multi-layered baffle member 140 and pass through the aforementioned curved gas passage.

As described above, the multi-layered baffle member 140 does not suppress the movement of the neutral gas particle 41 and bounces back the positively charged particle 42 to thereby separate the neutral gas particle 41 from the charged particles.

Meanwhile, as materials of the first and the second baffle plates 141 and 142, non-conductive $Al_2O_3$ or Al is preferable, but same as in the aforementioned first embodiment, the non-conductive and the conductive member may be included such that a processing-region surface 20a facing the processing region 8 has a non-conductive property and a gas passage-side surface facing the through holes 150 and 151 has a conductive property.

In accordance with the fourth embodiment, the multi-layered baffle member 140 is configured to separate the neutral gas particle 41 from the charged particles, so that an average moving direction of the neutral gas particle 41 can be separated from those of the charged particles. Further, an exhaust efficiency of the processing gas inside the processing region can be enhanced and the leakage of the plasma 40 can be surely suppressed, so that erosion of inner wall components of a manifold part is suppressed to thereby prolong a lifetime of the plasma processing device 30 and, at the same time, an inner pressure of the processing region 8 can be easily controlled.

In the fourth embodiment, the multi-layered baffle member 140 is formed of two rows of the first and the second baffle plates 141 and 142 but it is not limited thereto, and may be formed of at least three or more rows of baffle plates disposed in a series.

In the preferred embodiments of the present invention, a magnetron type parallel plate type plasma processing device 30 is employed but it is not limited thereto, and any plasma processing device having other type may be used as long as the plasma processing device requires to confine the plasma 40 in the processing region 8.

INDUSTRIAL APPLICABILITY

As mentioned above in detail, in accordance with a plasma processing device of the present invention, a separating unit separates an average moving direction of a neutral gas particle from those of charged particles, and thus is capable of separating an average moving direction of a neutral gas particle group from those of charged particle groups. Further, an exhaust efficiency of a processing gas inside a processing region can be enhanced and a leakage of a plasma can be surely suppressed, so that erosion of inner wall components of a manifold part is suppressed to thereby prolong a lifetime of the plasma processing device and, at the same time, an inner pressure of the processing region can be easily controlled.

In accordance with a plasma processing device of the present invention, a predetermined voltage is applied to a conductive portion such that a potential of a gas flow facing surface is higher than that of a processing region facing surface. Therefore, a movement of a neutral gas particle is not influenced and those of charged particles are suppressed, so that a moving direction of the neutral gas particle can be separated from those of the charged particles. Further, an exhaust efficiency of a processing gas inside a processing region can be enhanced and a leakage of a plasma can be surely suppressed.

In accordance with a plasma processing device of the present invention, since the potential of the gas flow facing surface is higher than that of the plasma, the moving directions of the charged particles can be further surely controlled.

In accordance with a plasma processing device of the present invention, an electric energy generated by a potential difference given by a difference between a potential of a gas flow facing surface and that of a plasma is not higher than a lowest energy needed for developing a discharge, so that an unnecessary discharging of a processing gas inside a processing region can be prevented in advance.

In accordance with a plasma processing device of the present invention, a separating unit is made of a wavy baffle member in which curved portions are formed alternately in a processing region and in an exhaust region, and the wavy baffle member has in each of slopes a gas passage hole. Therefore, it is possible to separate a neutral gas particle from charged particles by suppressing movements of the charged particles without influencing the movement of the neutral gas particle. Further, an exhaust efficiency of a processing gas inside the processing region can be enhanced and a leakage of a plasma can be surely suppressed.

In accordance with a plasma processing device of the present invention, a distance between a plurality of protruded portions in a baffle member is set such that equipotential surfaces of a sheath field generated in the vicinity of the baffle member substantially do not break into a space formed by the plurality of the protruded portions facing a processing region side therebetween. Accordingly, it is possible to move a positively charged particle to the normal direction to a baffle layer.

In accordance with a plasma processing device of the present invention, a gap between a plurality of curved portions in the processing region is substantially twice a thickness of a sheath formed in the vicinity of a baffle member or less, so that equipotential surfaces of a sheath field can be maintained substantially in parallel with a surface normal to a flow direction of a processing gas to be exhausted from the processing region.

In accordance with a plasma processing device of the present invention, there are provided one baffle members and another baffle members disposed in the processing region and in the exhaust region, respectively, and one baffle members are misaligned with another baffle members when viewed from the processing region. As a result, it is possible to separate a neutral gas particle from charged particles by bouncing back the charged particles without influencing any movement of the neutral gas particle. Further, an exhaust efficiency of a processing gas inside the processing region can be enhanced and a leakage of a plasma can be surely suppressed.

In accordance with a plasma processing device of the present invention, one baffle members and another baffle members are shielded to prevent from being seen from the processing region, and are disposed away from each other to form a space therebetween through which the neutral gas particle can pass. Therefore, an exhaust efficiency of a processing gas inside the processing region can be enhanced and a leakage of a plasma can be further surely suppressed.

In accordance with a plasma processing device of the present invention, an area of another baffle members is substantially equal to or larger than a total area of gas passage holes corresponding to another baffle members, the gas passage holes being formed by a plurality of one baffle members therebetween, and a total area of another gas passage holes formed by a plurality of another baffle members therebetween is substantially equal to or larger than the total area of the gas passage holes. Therefore, an exhaust efficiency of a processing gas inside a processing region can be enhanced and a leakage of a plasma can be surely suppressed.

In accordance with a plasma processing device of the present invention, since each of one baffle members and another baffle members is an annular member having a plurality of through holes, an exhaust efficiency of a processing gas inside a processing region can be further surely enhanced.

In accordance with a plasma processing device of the present invention, through holes in one baffle members are misaligned with those in another baffle members when viewed from a processing region, so that a leakage of a plasma can be more surely suppressed.

In accordance with a baffle plate of the present invention, an average moving direction of neutral gas particles is separated from those of charged particles in the vicinity of corresponding baffle plate, so that a moving direction of a neutral gas particle group can be separated from that of a charged particle group. Further, an exhaust efficiency of a processing gas inside a processing region can be enhanced and a leakage of a plasma can be surely suppressed, so that erosion of inner wall components of a manifold part is suppressed to thereby prolong a lifetime of the plasma processing device and, at the same time, an inner pressure of the processing region can be easily controlled.

In accordance with a baffle plate of the present invention, there are provided an opening through which a neutral gas particle passes, a non-conductive portion in a processing region contact surface having a contact with a processing region, and a conductive portion in a gas flow facing surface, which faces a flow of a processing gas exhausted. Further, a predetermined voltage is applied to the conductive portion such that a potential of a gas flow facing surface is higher than that of a processing region contact surface. As a result, an average moving direction of the neutral gas particle can be separated from those of charged particles by suppressing movements of the charged particles without suppressing that of the neutral gas particle. Further, an exhaust efficiency of a processing gas inside a processing region can be enhanced and a leakage of a plasma can be surely suppressed.

In accordance with a baffle plate of the present invention, moving directions of charged particles can be more surely controlled, since a potential of a gas flow facing surface is higher than that of a plasma.

In accordance with a baffle plate of the present invention, an electric energy generated by a potential difference given by a difference between a potential of a gas flow facing surface and that of a plasma is not higher than a lowest energy needed for developing a discharge, so that an unnecessary discharging of a processing gas inside a processing region can be prevented previously.

In accordance with the present invention, a baffle plate has a wave shape having a plurality of protruded portions facing a processing region, and a gas passage hole is formed in each slope of corresponding wave surface. Accordingly, a neutral gas particle can be separated from charged particles by suppressing movements of the charged particles without influencing any movement of the neutral gas particle. Further, an exhaust efficiency of a processing gas inside a processing region can be enhanced and a leakage of a plasma can be surely suppressed.

In accordance with a baffle plate of the present invention, a distance between a plurality of protruded portions are set such that equipotential surfaces of a sheath field generated in the vicinity of the baffle member substantially do not break into a space formed by the plurality of the protruded portions facing a processing region side therebetween. Accordingly, it is possible to move a positively charged particle to the normal direction to a baffle layer.

In accordance with a baffle plate of the present invention, a distance between the plurality of the protruded portions is substantially twice a thickness of a sheath formed in the vicinity of a baffle member or less, so that equipotential surfaces of a sheath field can be maintained substantially in parallel with a surface normal to a flow direction of a processing gas to be exhausted from the processing region.

In accordance with a baffle plate of the present invention, there are provided one baffle members having a contact with a processing region and another baffle members facing one baffle members of the processing region, and one baffle member is misaligned with another baffle member when viewed from the processing region. As a result, it is possible to separate a neutral gas particle from charged particles by bouncing back the charged particles without suppressing a movement of the neutral gas particle. Further, an exhaust efficiency of a processing gas inside the processing region can be enhanced and a leakage of a plasma can be surely suppressed.

In accordance with a baffle plate of the present invention, one baffle members and another baffle members shield an exhaust region when viewed from the processing region, and are disposed away from each other to form a space therebetween through which the neutral gas particle can pass. Therefore, an exhaust efficiency of a processing gas inside the processing region can be enhanced and a leakage of a plasma can be further surely suppressed.

In accordance with a baffle plate of the present invention, an area of another baffle members is substantially equal to or larger than a total area of gas passage holes corresponding to another baffle members, the gas passage holes being formed by a plurality of one baffle members therebetween, and a total area of another gas passage holes formed by a plurality of another baffle members therebetween is substantially equal to or larger than the total area of the gas passage holes. Therefore, an exhaust efficiency of a processing gas inside a processing region can be enhanced and a leakage of a plasma can be surely suppressed.

In accordance with a baffle plate of the present invention, since each of one baffle members and another baffle members is an annular member having a plurality of through holes, an exhaust efficiency of a processing gas inside a processing region can be further surely enhanced.

In accordance with a baffle plate of the present invention, through holes in one baffle members are misaligned with those in another baffle members when viewed from a processing region, so that a leakage of a plasma can be more surely suppressed.

What is claimed is:

1. A plasma processing device comprising:
   a processing container;
   a separating unit for dividing an inside of the processing container into a processing region and an exhaust region,
      wherein a processing gas is introduced into the processing region and an object to be processed is processed therein, and
      wherein the processing gas supplied is exhausted to the exhaust region; and
   a discharging unit for discharging in the processing region to produce a plasma formed of charged particles and neutral gas particles by ionizing the processing gas supplied,
   wherein the separating unit includes;
      an opening through which the neutral gas particles pass;
      a non-conductive portion in a processing region facing surface, which faces the processing region; and
      a conductive portion in a gas flow facing surface, which faces a flow of the processing gas exhausted to the exhaust region from the processing region, and
   wherein the separating unit separates an average moving direction of the neutral gas particles from those of the charged particles in the vicinity of the separating unit.

2. The plasma processing device of claim 1, wherein a predetermined voltage is applied to the conductive portion such that a potential of the gas flow facing surface is higher than that of a processing region facing surface.

3. The plasma processing device of claim 2, wherein the predetermined voltage is set such that a potential of the gas flow facing surface is higher than that of the plasma.

4. The plasma processing device of claim 2, wherein the predetermined voltage is set such that an electric energy, which is generated by a potential difference defined as a difference between a potential of the gas flow facing surface and that of the plasma, is not higher than a lowest energy needed for developing a discharging.

5. The plasma processing device of claim 1, wherein the separating unit is formed of a baffle member having curved waves such that curved portions are alternately formed in the processing region and in the exhaust region, and
   wherein the baffle member has a gas passage hole in each slope.

6. The plasma processing device of claim 5, wherein a distance between a plurality of protruded portions in the baffle member is set such that equipotential surfaces of a sheath field generated in the vicinity of the baffle member substantially do not break into a space formed by the plurality of the protruded portions facing a processing region side therebetween.

7. The plasma processing device of claim 5, a gap between the curved portions in the processing region is substantially twice a thickness of a sheath formed in the vicinity of the baffle member or less.

8. The plasma processing device of claim 1, wherein the separating unit includes one group of baffle members disposed in the processing region and another group of baffle members disposed in the exhaust region, and said one baffle members are misaligned with said another baffle members when viewed from the processing region.

9. The plasma processing device of claim 8, wherein said one group of baffle members and said another group of baffle members shade the exhaust region when viewed from the processing region, and are disposed away from each other to form a space through which the neutral gas particle passes.

10. The plasma processing device of claim 8, wherein said one group of baffle members and said another group of baffle members are of a flat plate.

11. The plasma processing device of claim 10, wherein an area of said another group of baffle members is substantially equal to or larger than a total area of gas passage holes corresponding to said another group of baffle members, the gas passage holes being formed by a plurality of said one group of baffle members therebetween, and a total area of another gas passage holes formed by a plurality of said another group of baffle members therebetween is substantially equal to or larger than the total area of the gas passage holes.

12. The plasma processing device of claim 10, wherein each of said one group of baffle members and said another group of baffle members is an annular member having a plurality of through holes.

13. The plasma processing device of claim 12, wherein the plurality of the through holes are disposed in a concentric circle of the annular member.

14. The plasma processing device of claim 12, wherein the plurality of the through holes in said one group of baffle members are misaligned with those in said another group of baffle members when viewed from the processing region.

15. The plasma processing device of claim 8, wherein said one group of baffle members and said another group of baffle members are of a blade shape.

16. The plasma processing device of claim 8, wherein at least one of said one group of baffle members and said another group of baffle members includes:

a non-conductive portion in a processing region facing surface, which faces the processing region; and a conductive portion in a gas flow facing surface, which faces a flow of the processing gas from the processing region to the exhaust region, wherein a predetermined voltage is applied to the conductive portion such that a potential of the gas flow facing surface is higher than that of a processing region facing surface.

17. The plasma processing device of claim 16, wherein the predetermined voltage is set such that a potential of the gas flow facing surface is higher than that of the plasma.

18. The plasma processing device of claim 16, wherein the predetermined voltage is set such that an electric energy, which is generated by a potential difference defined as a difference between a potential of the gas flow facing surface and that of the plasma, is not higher than a lowest energy needed for developing a discharging.

19. A baffle plate for dividing an inside of a processing container of a plasma processing device into a processing region and an exhaust region, wherein a plasma formed of neutral gas particles and charged particles, which are generated by ionizing a processing gas supplied into the processing container of the plasma processing device, wherein the processing gas is introduced into the processing region performing a processing therein on an object to be processed, and is exhausted to the exhaust region when being exhausted, the baffle plate comprising:

an opening through which the neutral gas particle passes;

a non-conductive portion in a processing region contact surface having a contact with the processing region; and a conductive portion in a gas flow facing surface, which faces a flow of the processing gas exhausted, wherein an average moving direction of the neutral gas particles is separated from those of the charged particles in the vicinity of the baffle plate.

20. The baffle plate of claim 19, wherein a predetermined voltage is applied to the conductive portion such that a potential of the gas flow facing surface is higher than that of a processing region contact surface.

21. The baffle plate of claim 20, wherein the predetermined voltage is set such that a potential of the gas flow facing surface is higher than that of the plasma.

22. The baffle plate of claim 20, wherein the predetermined voltage is set such that an electric energy, which is generated by a potential difference defined as a difference between a potential of the gas flow facing surface and that of the plasma, is not higher than a lowest energy needed for starting the discharging.

23. The baffle plate of claim 19, wherein waves having a plurality of protruded portions facing the processing region are formed and, a gas passage hole is formed in each slope of corresponding wave surface.

24. The baffle plate of claim 23, a distance between the plurality of the protruded portions is set such that equipotential surfaces of a sheath field generated in the vicinity of the baffle member substantially do not break into a space formed by the plurality of the protruded portions facing a processing region side therebetween.

25. The baffle plate of claim 23, a distance between the plurality of the protruded portions is substantially twice a thickness of a sheath formed in the vicinity of a baffle member or less, so that equipotential surfaces of a sheath field can be maintained substantially in parallel with a surface normal to a flow direction of a processing gas to be exhausted from the processing region.

26. The baffle plate of claim 19, including:

one group of baffle members disposed in the processing region; and another group of baffle members disposed in the exhaust region, wherein said one group of baffle members are misaligned with said another group of baffle members when viewed from the processing region.

27. The baffle plate of claim 26, wherein said one group of baffle members and said another group of baffle members shade the exhaust region when viewed from the processing region, and are disposed away from each other to form a space through which the neutral gas particle passes.

28. The baffle plate of claim 26, wherein said one group of baffle members and said another group of baffle members are of a flat plate.

29. The baffle plate of claim 28, wherein an area of said another group of baffle members is substantially equal to or larger than a total area of gas passage holes corresponding to said another group of baffle members, the gas passage holes being formed by a plurality of said one group of baffle members therebetween, and a total area of another gas passage holes formed by a plurality of said another group of baffle members therebetween is substantially equal to or larger than the total area of the gas passage holes.

30. The baffle plate of claim 28, wherein each of said one group of baffle members and said another group of baffle members is an annular member having a plurality of through holes.

31. The baffle plate of claim 30, wherein the plurality of the through holes are disposed in a concentric circle of the annular member.

32. The baffle plate of claim 31, wherein the plurality of the through holes in said one group of baffle members are misaligned with those in said another group of baffle members when viewed from the processing region.

33. The baffle plate of claim 26, wherein said one group of baffle members and said another group of baffle members are of a blade shape.

34. The baffle plate of claim 26, wherein at least one of said one group of baffle members and said another group of baffle members includes:
- a non-conductive portion in a processing region contact surface, which faces the processing region; and
- a conductive portion in a gas flow facing surface, which faces a flow of the processing gas exhausted,
- wherein a predetermined voltage is applied to the conductive portion such that a potential of the gas flow facing surface is higher than that of a processing region contact surface.

35. The baffle plate of claim 34, wherein the predetermined voltage is set such that a potential of the gas flow facing surface is higher than that of the plasma.

36. The baffle plate of claim 34, wherein the predetermined voltage is set such that an electric energy, which is generated by a potential difference defined as a difference between a potential of the gas flow facing surface and that of the plasma, is not higher than a lowest energy needed for developing a discharging.

* * * * *